United States Patent [19]
Doan et al.

[11] Patent Number: 5,384,284
[45] Date of Patent: Jan. 24, 1995

[54] METHOD TO FORM A LOW RESISTANT BOND PAD INTERCONNECT

[75] Inventors: Trung T. Doan; Mark E. Tuttle, both of Boise, Id.

[73] Assignee: Micron Semiconductor, Inc., Boise, Id.

[21] Appl. No.: 130,225

[22] Filed: Oct. 1, 1993

[51] Int. Cl.⁶ ............................................. H01L 21/44
[52] U.S. Cl. ..................... 437/190; 437/192; 437/194
[58] Field of Search ........................ 437/190, 192, 194

[56] References Cited

U.S. PATENT DOCUMENTS

| | | | |
|---|---|---|---|
| 5,170,930 | 12/1992 | Dolbear et al. | 228/123 |
| 5,173,765 | 12/1992 | Nakayoshi et al. | 257/783 |
| 5,249,728 | 10/1993 | Lam | 228/111 |
| 5,290,588 | 3/1994 | Romero et al. | 437/190 |

*Primary Examiner*—Olik Chaudhuri
*Assistant Examiner*—C. Everhart
*Attorney, Agent, or Firm*—David J. Paul

[57] ABSTRACT

The present invention develops a bond pad interconnect in an integrated circuit device, by forming an aluminum pad; bonding a metal layer (such as copper (Cu), nickel (Ni), tungsten (W), gold (Au), silver (Ag) or platinum (Pt)) or a metal alloy (such as titanium nitride) to the aluminum bond pad by chemical vapor deposition or by electroless deposition; and adhering a conductive epoxy film to the metal layer, thereby forming a low resistive bond pad interconnect.

24 Claims, 1 Drawing Sheet

METHOD TO FORM A LOW RESISTANT BOND PAD INTERCONNECT

FIELD OF THE INVENTION

This invention relates to semiconductor technology, and more specifically, to a low resistant bond pad interconnect and a method to form the same.

BACKGROUND OF THE INVENTION

For integrated circuits using radio frequency (RF) signals for transmitting and receiving data, there is a need to contact the bond pads (typically aluminum) with a conductive epoxy material for use as an interconnect. For example, bond pads are needed that connect to a battery, an antenna or other devices.

The conventional approach, as seen in FIG. 1, is to expose the aluminum bond pad 10 and place conductive epoxy 12 to adhere to pad 10. However, when an aluminum bond pad is exposed to air, the aluminum reacts with the oxygen that may be present and forms $Al_2O_3$ which is an insulator. Once the IC is cured (subjected to heat) the conductive epoxy 12 connection to the aluminum pad 12 has the insulating film 13 of $Al_2O_3$ which can result in a pad interconnect in the range up to several megohms, which is undesirable.

A low resistive pad interconnect is needed, particularly in the RF field. For example, if the pad interconnect resistance is too high, then signal drop results, that in turn causes a high noise to signal ratio and power loss for the case of a battery.

SUMMARY OF THE INVENTION

A main focus of the present invention is to form a low resistant bond between two conductive materials.

In a general aspect, the present invention provides a structure wherein a pad connects to an interconnecting material which comprises:
 a conductive supporting layer serving as the pad;
 an intermediate conductive layer bonding to the conductive supporting layer; and
 the interconnecting material adhering to the intermediate conductive layer.

In a general aspect the present invention is realized in process to form a pad interconnect by:
 forming a conductive supporting layer serving as the pad;
 bonding an intermediate conductive layer to the conductive supporting layer;
 and adhering an interconnecting material to the intermediate conductive layer.

EMBODIMENTS OF THE INVENTION

Figure 1:
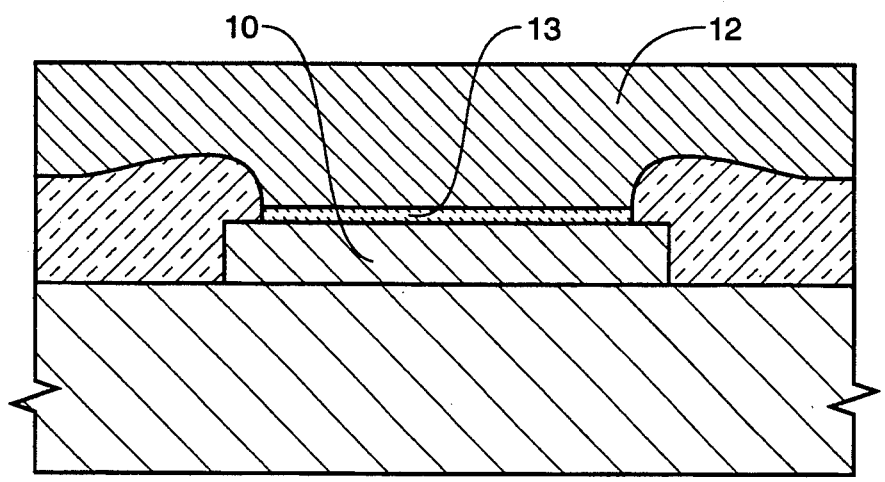
FIG. 1 depicts a conventional method of attaching a bond pad to an overlying conductive epoxy material.
Figure 2:
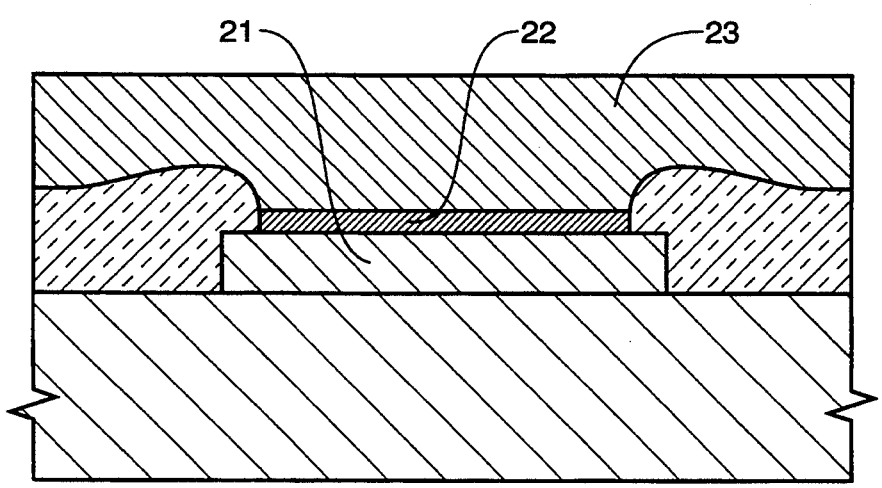
FIG. 2 depicts a low resistant bond pad interconnect of the present invention.

The preferred embodiment of the liquid vapor deposition process includes the steps depicted in FIG. 2.

Referring now to FIG. 2, a conductive supporting layer 10 (such as an aluminum bond pad) is formed and exposed to a subsequent formation of an intermediate conductive layer 11. It is preferred that conductive layer 11 be copper if conducting support layer 10 is aluminum. However, other metals such as, nickel (Ni), tungsten (W), gold (Au), silver (Ag) or platinum (Pt) or metal alloys, such as titanium nitride (TiN) will work as a substitute for copper if so desired. The metal (or metal alloy) selected is either deposited by either chemical vapor deposition, by electroless deposition, by selective chemical vapor deposition, or by selective electroless deposition. A conductive interconnecting material 12 adheres to the intermediate conductive layer 11 and provides the desired connections to other intermediate conductive layers 11 that coat the supporting layer 10.

For example, by using electroless deposition to deposit copper, a copper sulfate solution and a reducing agent EDTA is presented to the bond pad's 10 aluminum surface. The copper sulfate and the EDTA react, thereby forming a copper film 11 that adheres to the aluminum pad 10.

As an example of selective electroless deposition of tungsten (at approximately 370° C.) the following reaction will occur:

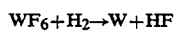

As a general example of electroless deposition of metals the following reaction will occur:

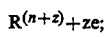

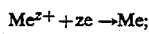

where
 $R^{n+}$ is the reducing agent;
 $R^{(n+z)}$ is the oxidized reducing agent;
 ze are the surrender electrons;
 $Me^{z+}$ is the metal being deposited by electroless deposition (such as nickel or copper); and
 Me is the final electroless deposited metal.

After the copper bonds 11 to the aluminum pad 10, a conductive epoxy 12 is placed to adhere itself to the copper 12. The resulting contact resistance is less than $1\Omega$/pad.

Although the present invention is described in various embodiments, it will be apparent to one skilled in the art that changes and modifications may be made thereto without departing from the spirit and scope of the invention as claimed.

We claim:

1. A process to form a pad interconnect, said process comprising:
 a) forming a conductive supporting layer serving as said pad;
 b) bonding an intermediate conductive layer to said conductive supporting layer; and
 c) adhering an interconnecting material, comprising a conductive epoxy material, to said intermediate conductive layer.

2. The process of claim 1, wherein said conductive supporting layer comprises aluminum.

3. The process of claim 1, wherein step "b" comprises chemical vapor deposition of said intermediate conductive material.

4. The process of claim 1, wherein said chemical vapor deposition is selective and thereby deposits metal on said conductive supporting layer only.

5. The process of claim 1, wherein step "b" comprises electroless deposition of said intermediate conductive material.

6. The process of claim 5, wherein said electroless deposition is selective and thereby deposits metal on said conductive supporting layer only.

7. The process of claim 1, wherein said intermediate conductive layer comprises a metal compound.

8. The process of claim 7, wherein said metal compound comprises titanium nitride.

9. The process of claim 1, wherein said intermediate conductive layer comprises a metal selected from the group consisting of copper (Cu), nickel (Ni), tungsten (W), gold (Au), silver (Ag) and platinum (Pt).

10. The process of claim 1, wherein said intermediate conductive layer comprises a conductive passivating film.

11. A process for forming a bond pad interconnect, said process comprising:
   a) forming an aluminum supporting layer serving as said bond pad;
   b) bonding an intermediate conductive layer to said aluminum supporting layer; and
   c) adhering an interconnecting conductive material, comprising a conductive epoxy material, to said intermediate conductive layer.

12. The process of claim 11, wherein step "b" comprises chemical vapor deposition of said intermediate conductive material.

13. The process of claim 12, wherein said chemical vapor deposition is selective and thereby deposits metal on said conductive supporting layer only.

14. The process of claim 11, wherein step "b" comprises electroless deposition of said intermediate conductive material.

15. The process of claim 14, wherein said electroless deposition is selective and thereby deposits metal on said conductive supporting layer only.

16. The process of claim 11, wherein said intermediate conductive layer comprises a metal compound.

17. The process of claim 16, wherein said metal compound comprises titanium nitride.

18. The process of claim 11, wherein said intermediate conductive layer comprises a metal selected from the group consisting of copper (Cu), nickel (Ni), tungsten (W), gold (Au), silver (Ag) and platinum (Pt).

19. The process of claim 11, wherein said interconnecting material comprises a conductive passivating film.

20. A process for forming a bond pad interconnect in an integrated circuit device, said process comprising:
   a) forming an aluminum supporting layer serving as said bond pad;
   b) bonding an intermediate conductive layer to said aluminum supporting layer; and
   c) adhering an interconnecting conductive material, comprising a conductive epoxy material, to said intermediate conductive layer.

21. The process of claim 20, wherein said intermediate conductive layer comprises a metal compound.

22. The process of claim 21, wherein said metal compound comprises titanium nitride.

23. The process of claim 20, wherein said intermediate conductive layer comprises a metal selected from the group consisting of copper (Cu), nickel (Ni), tungsten (W), gold (Au), silver (Ag) and platinum (Pt).

24. The process of claim 23, wherein said intermediate conductive layer comprises a conductive passivating film.

* * * * *

UNITED STATES PATENT AND TRADEMARK OFFICE
CERTIFICATE OF CORRECTION

PATENT NO. : 5,384,284
DATED : January 24, 1995
INVENTOR(S) : Trung T. Doan, et al It is certified that error appears in the above-indentified patent and that said Letters Patent is hereby corrected as shown below:

Column 1, line 64, kindly delete "10" and insert --21--;

Column 1, line 66, kindly delete "11" and insert --22--;

Column 1, line 67, kindly delete "11" and insert --22--;

Column 1, line 67, kindly delete "10" and insert --21--;

Column 2, line 7, kindly delete "12" and insert --23--;

Column 2, line 8, kindly delete "11" and insert --22--;

Column 2, line 10, kindly delete "11" and insert --22--;

Column 2, line 10, kindly delete "10" and insert --21--;

Column 2, line 13, kindly delete "10" and insert --21--;

Column 2, line 15, kindly delete "11" and insert --22--;

Column 2, line 16, kindly delete "10" and insert --21--;

UNITED STATES PATENT AND TRADEMARK OFFICE
CERTIFICATE OF CORRECTION

PATENT NO. : 5,384,284

DATED : January 24, 1995

INVENTOR(S) : Trung T. Doan, et al

It is certified that error appears in the above-indentified patent and that said Letters Patent is hereby corrected as shown below:

Column 2, line 38, kindly delete "11" and insert --22--;

Column 2, line 38, kindly delete "10" and insert --21--;

Column 2, line 39, kindly delete "12" and insert --23--; and

Column 2, line 34, kindly delete "12" and insert --23--.

Signed and Sealed this

Twenty-seventh Day of June, 1995

Attest:

BRUCE LEHMAN

*Attesting Officer*   *Commissioner of Patents and Trademarks*